United States Patent

[11] 3,615,449

[72] Inventor David Leslie Greenaway
Bassersdorf, Switzerland
[21] Appl. No. 860,865
[22] Filed Sept. 25, 1969
[45] Patented Oct. 26, 1971
[73] Assignee RCA Corporation

[54] METHOD OF GENERATING HIGH AREA-DENSITY PERIODIC ARRAYS BY DIFFRACTION IMAGING
15 Claims, 5 Drawing Figs.

[52] U.S. Cl. 96/35, 96/36.1, 96/27 R, 96/38.2, 96/36, 350/162 R, 350/162 SF
[51] Int. Cl. G03c 5/00, G02b 5/18
[50] Field of Search 96/35, 36, 36.1, 38.2, 27 R, 36.2, 27 H, 38; 350/162 SF, 162 R

[56] References Cited

UNITED STATES PATENTS 2,478,443 8/1949 Yule et al. 596/45
3,329,541 7/1967 Mears 156/11
3,423,261 1/1969 Frantzen 156/11

*Primary Examiner*—Harold Ansher
*Assistant Examiner*—Joseph C. Gil
*Attorney*—Glenn H. Bruestle

ABSTRACT: High area-density arrays, such as diode array vidicon camera tube targets and electron tube electrode screens, are made by photolithographic printing utilizing a photomask diffraction image rather than a photomask shadow for exposing a photoresist masking layer. To form the masking layer, a relatively flat photoresist layer is exposed to a periodic array diffraction image from a photomask. The exposed portions of the layer are removed, leaving an array of unexposed portions. Alternatively, the unexposed portions of the layer may be removed, leaving an array of exposed portions. During the exposure, the layer is oscillated over a distance of essentially one-quarter the wavelength of the light and in a direction substantially perpendicular to the surface of the layer to avoid the appearance of interference fringe patterns after development.

INVENTOR.
David L. Greenaway
BY
Volker R. Ulbrich
ATTORNEY

INVENTOR.
David L. Greenaway
BY
Volker R. Ullbrich
ATTORNEY

INVENTOR.
David L. Greenaway
BY
Volker R. Ulbrich
ATTORNEY

METHOD OF GENERATING HIGH AREA-DENSITY PERIODIC ARRAYS BY DIFFRACTION IMAGING

BACKGROUND OF THE INVENTION

The invention relates to photomasking techniques and concerns specifically a method of fabricating micro-electronic component arrays.

There is a need for photoetching of high area-density arrays with resolutions on the order of 100 to 5,000 lines per inch. Such arrays may be, for instance, electrode screens for camera tubes or silicon diode array vidicon targets of the general type described for example in the U.S. Pat. No. 3,419,746 to M.H. Crowell et al.

A silicon vidicon target of this type generally has a monocrystalline N-type silicon substrate wafer with an array of discrete P-type regions on one major surface. Each P-type region forms a PN junction with the N-type substrate to result in a separate diode component of an array of diodes. An insulating layer of silicon dioxide covers the substrate surface between the P-type regions. Pads of polycrystalline silicon are provided in contact with each P-type region and overlapping somewhat the insulating layer about the P-type region.

An important requirement for a silicon vidicon target intended for commercial television applications is that the signals from individual diodes be imperceptible to the eye in a displayed signal from the target. It is desirable, therefore, that the area density of the diodes be on the order of 3 million or more diodes per square inch of target surface. The primary difficulty in fabricating targets with such high area-densities is that of forming a high area-density pattern of photosensitive material such as photoresist to act as a masking layer for defining the discrete diode areas of the target. Once a masking layer of photoresist with sufficiently few faults and sufficient area-density has been formed on the target, the processing of the target through openings in the photoresist can be carried out in standard fashion.

At present the photoresist patter for silicon vidicon targets is made by contact printing. Contact printing, however, presents difficulties. One difficulty is that even small, isolated defects in the photomask generally smaller than one unit of the array, such as missing dots or squares or unwanted opaque areas between the dots or squares, are reproduced in the photoresist pattern. Moreover, each contact of the photomask with the photoresist is likely to result in the introduction in the photomask of defects such as scratches or adhering opaque foreign matter. These defects in the photomask usually result in defective diodes in the finished target which are quite noticeable in a displayed signal from the target. They appear as bright or dark spots or lines, depending upon the type of defect. The accumulation of defects in a photomask severely limits its useful lifetime, and the replacement of defective high-density array masks is a significant factor in the production cost of a silicon vidicon target.

Another difficulty presented in the present technique of fabricating a silicon vidicon target is that the pads defined by the pad mask must register precisely with the dot openings defined by the dot mask. Without such precise registration the pads in some areas of the target are either off center from the P-type regions or in contact with more than one P-region. The result in either case is a nonuniformity in the displayed signal from the target. The pads can be registered with the P-type regions only if the periodicities of both the pad and photomask and the dot photomask are the same over their entire effective areas. With present techniques, it is very difficult and costly to obtain essentially defect-free dot and pad photomasks with sufficiently similar periodicity and sufficient high area-density to be used for the fabrication of silicon vidicon targets acceptable for commercial television applications.

SUMMARY OF THE INVENTION

The novel method of forming a periodic array of photosensitive material comprises the steps of exposing a relatively flat layer of the material to a periodic array diffraction image from a photomask. Portions of the layer are thus exposed. The exposed portions are removed, leaving an array of unexposed portions. Alternatively, the unexposed portions of the layer may be removed, leaving an array of exposed material.

With prior methods, isolated small defects in the photomask are reproduced in a periodic array of photosensitive material formed with the photomask. With the novel method, isolated small defects in the photomask are reduced or eliminated in the reproduced array. Inherent redundancy in the diffraction image used to expose the photosensitive material effectively reduces or eliminates the defects.

Whereas for best results prior methods require that there be physical contact between the photomask and the photosensitive material, the novel method requires no contact whatsoever, and thus avoids degradation of the photomask through use.

The novel method permits a first array of microelectronic components to be associated with a second array of microelectronic components with precise registry of the first array with the second array, even for high area-density arrays of such components. This complete registry is assured by the use of the same photomask for forming both the first and second arrays.

DESCRIPTION OF THE PREFERRED EMBODIMENT

Figure 1:
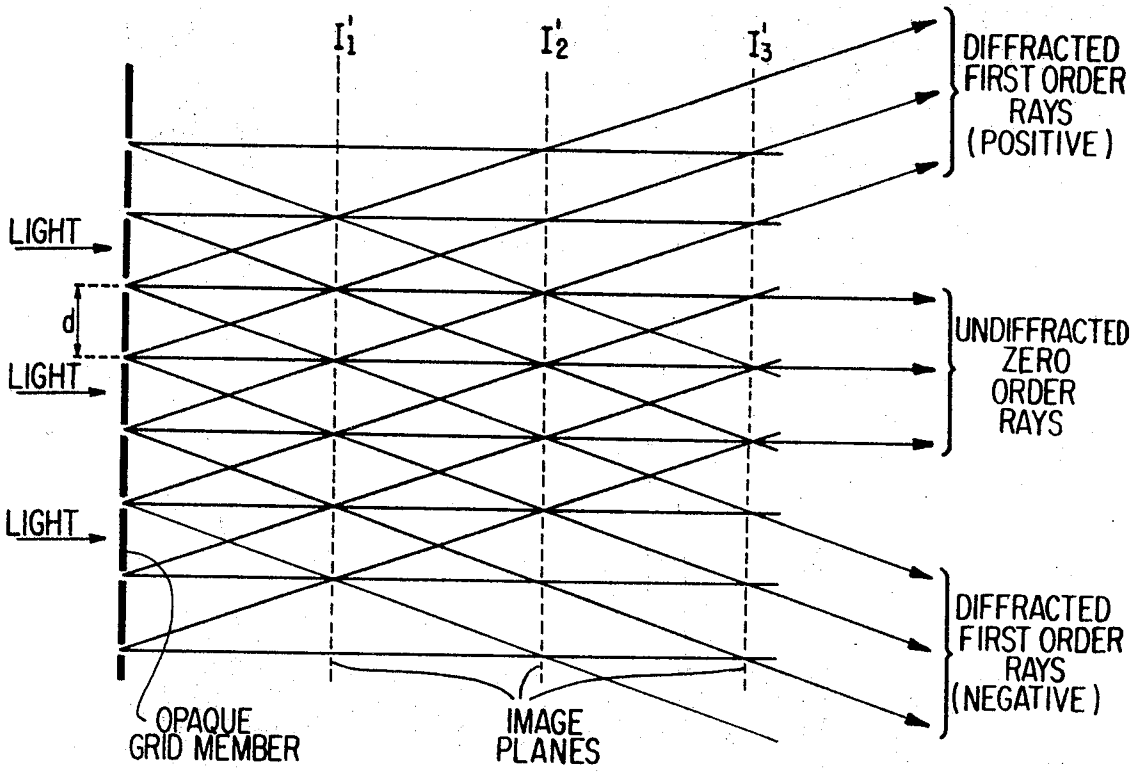
PRIOR ART Fig. 1.
FIG. 1 is a sectional view of an optical grating illustrating the principle of self-imaging occurring when collimated, monochromatic, light is passed through the grating.

To facilitate an understanding of the description of the preferred embodiment, there is shown in FIG. 1 a prior art structure illustrating the forming of a diffraction image from an optical grating. In the FIG. 1 collimated monochromatic light of wavelength $\lambda$ is incident normally on the grating surface. It can be seen that there exists a set of planes, designated $\underline{I}_1^1$ and $\underline{I}_2^1$ etc., in the drawing, where the positive and negative first order diffracted rays from the narrow transparent lines of the grating intersect the undiffracted zero order rays. The plane $\underline{I}_1^1$ is the plane of the first first-order self-image of the pattern, and the plane $\underline{I}_2^1$ is the plane of the second first-order self-image of the pattern. These self-images, hereinafter referred to as "diffraction images," are real images and may be recorded by placing a suitable photosensitive-recording medium in the appropriate plane. For second order positive and negative diffracted rays from the grating, there will also be a set of planes where these rays intersect the zero order undiffracted rays. These planes constitute the first, second, third, etc. diffraction images for the second order, and may be designated by $\underline{I}_1^2, \underline{I}_2^2, \underline{I}_3^2$ etc., counted from the grating surface. However, to avoid confusion they are not shown in the drawings. In the general case the *m*th. diffraction image for the *n*th. order rays $I_m^n$ is located at a distance $S_m^n$ from the grating surface. $S_m^n$ is determined by the expression $$S_m{}^n = \frac{md^2}{n\lambda}\sqrt{1-\frac{n^2\lambda^2}{d^2}} \qquad (1)$$

where *d* is the dimension of the grating unit (line separation) and *m* and *n* are always integers. For the case where $d >> \lambda$ and *n* is restricted to a small integer, this expression reduces to $$S_m^n = \frac{md^2}{n\lambda} \qquad (2)$$

From this it can be seen that all diffraction images where $m/n$ = constant will lie on the same plane and reinforce each other. It can further be seen that if the grating consists of more than one set of lines, for example two sets of lines at right angles to each other, then in-focus diffraction images of both sets of lines can be obtained simultaneously, even if the dimension of the pattern unit $d$ is different for each set. The relative magnitudes of the two $d$ values must only be chosen in such a way that equation 2 is satisfied with a different $m/n$ value for each of the $d$ values.

A further important feature is that any given point in a different image will possess contributions from rays arising from a number of different points on the grating surface. This is due to the multiple orders of diffracted rays which combine to form any general diffraction image. Higher diffraction images (larger values of $m$) will be formed from diffracted rays generated at more widely displaced points on the pattern surface than lower diffraction images (lower values of $m$). This redundancy of diffraction image formation means that environment defects, i.e., dust and scratches, present on the grating surface, will be minimized or even for practical purposes completely eliminated by the diffraction-imaging process. This redundancy also means that small defects in the actual grating will in effect be repaired by the process and not appear on the final diffraction image. These features constitute a major advantage when perfect defect-free reproduction of a given pattern over a large area is required.

Figure 2:
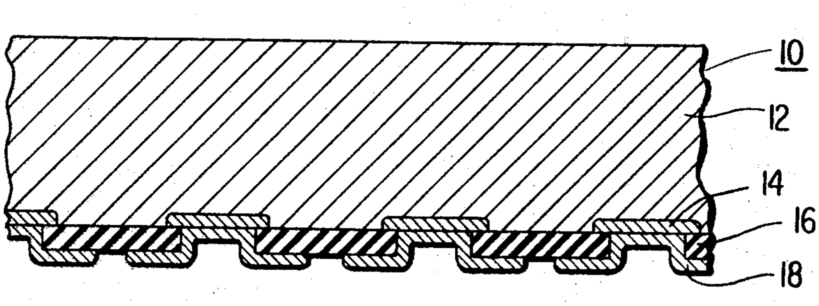
PRIOR ART Fig. 2.
FIG. 2 is an exaggerated, fragmentary, sectional view of a prior art diode array silicon vidicon television camera tube target fabricated according to the novel method by the preferred embodiment.
Figure 3:
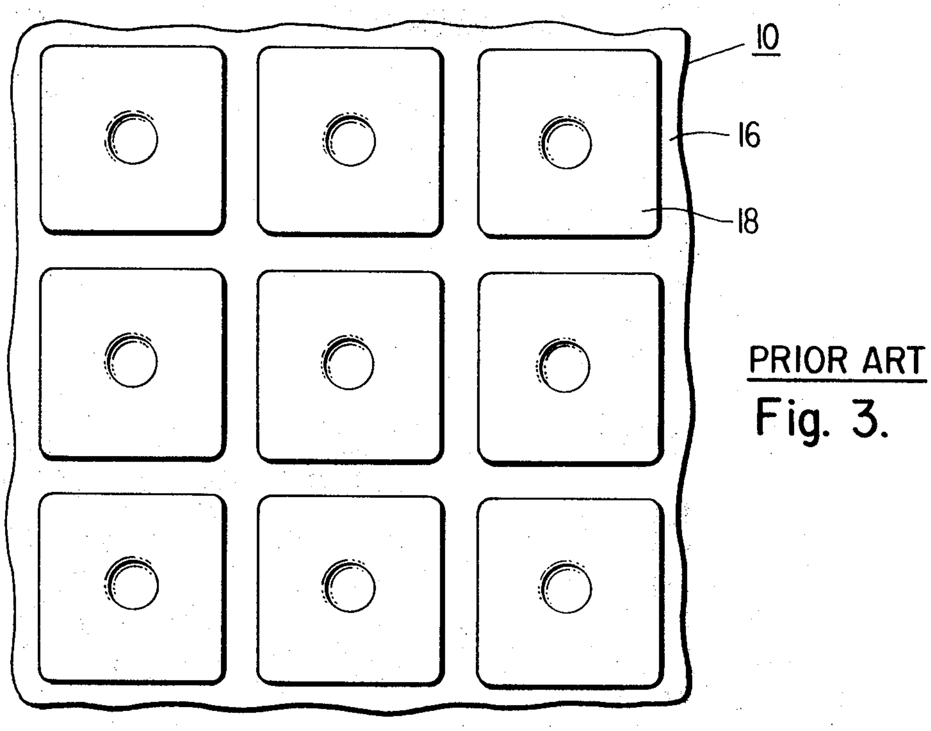
PRIOR ART Fig. 3.
FIG. 3 is an exaggerated, fragmentary, surface view of the diode-containing surface of the target of FIG. 2.

The method exemplified by the preferred embodiment makes use of the self-imaging principle of light to fabricate the target 10 of FIGS. 2 and 3. The target 10 is a prior art structure having a conventional monocrystalline N-type silicon substrate 12, P-type silicon regions 14 in an array of dots in the substrate 12, an insulating masking layer 16 of silicon dioxide on the substrate 12 between the P-type regions 14, and square-shaped silicon pads 18 on the P-type regions 14 and overlapping the nearby insulating layer 16.

Figure 4:
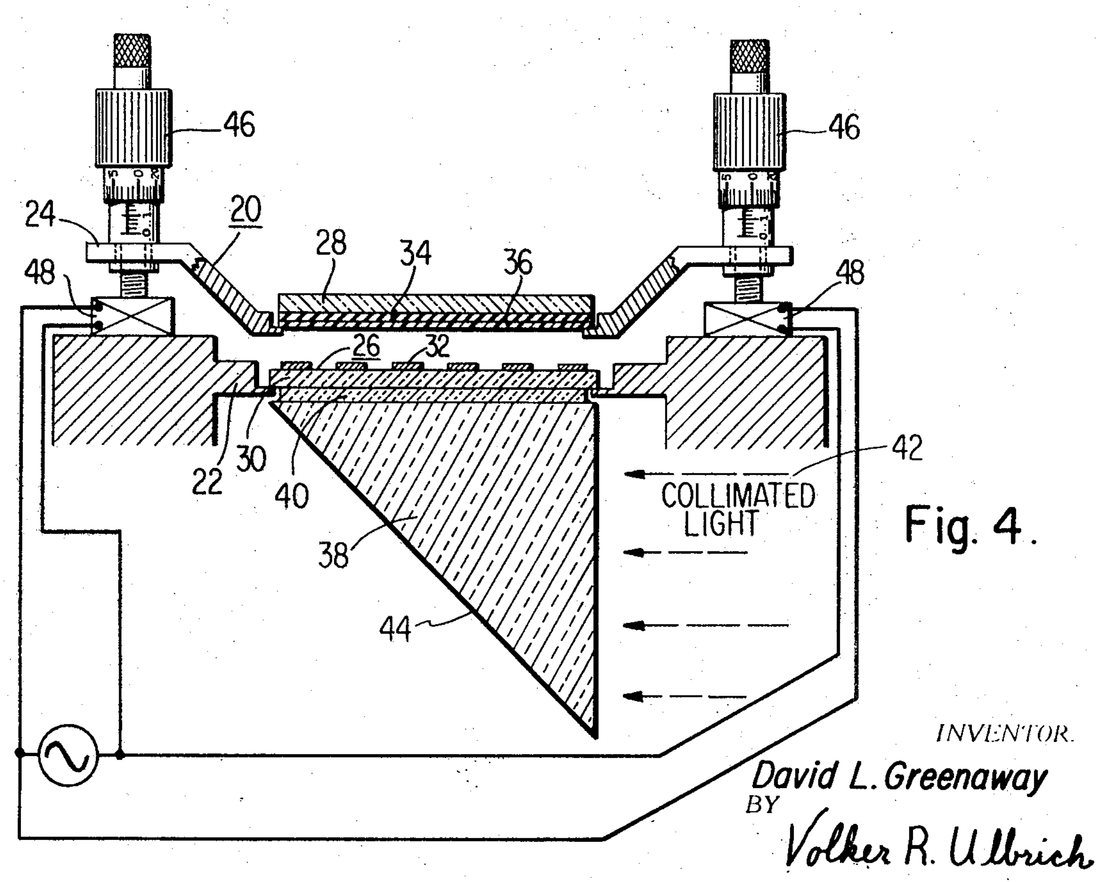
FIG. 4 is a simplified, sectional view of an apparatus used in practicing the preferred embodiment of the invention.

An apparatus 20 used in practicing the preferred embodiment is shown schematically in FIG. 4. The apparatus 20 is, in essence, a special purpose optical bench having a mask frame 22, and a target frame 24. The frames 22, 24 are for precisely aligning the position of a photomask 26 mounted in the mask frame 22 in parallel relationship with a flat, coated target substrate 28 mounted in the target frame 24. The entire apparatus 20 is preferably housed in a relatively dust-free environment.

The photomask 26 includes a thin glass sheet 30 having on one major surface a crossed grid ruling 32 of opaque indium squares separated by openings about 3.2-microns wide. There are 1,839 squares per inch on the photomask 26, each square having a thickness of several hundred Angstroms. The ruling 32 of the photomask 26 faces the target substrate 28.

The substrate 28, spaced at about 1,200 microns from the ruling 32 of the photomask 26, is a conventional monocrystalline silicon substrate about 5-mils thick and ⅞" in diameter with a flatness to within about 5 microns over the surface facing the photomask 26. The surface of the substrate 28 facing the photomask 26 is covered with an insulating layer 34 of silicon dioxide. The insulating layer 34 is covered with a photoresist layer 36 of commercially available high definition photoresist, such as, for instance, "Kodak" brand thin film resist (KTFR) manufactured by the Eastman Kodak Co. of Rochester, N.Y.

A 45° optical glass prism 38 is seated against the nonruled major surface of the photomask 26 with a matching layer of optical oil 40. The refractive indices of the photomask glass sheet 30, the optical oil 40, and the prism 38 are essentially equal.

The photoresist 36 is exposed to a light pattern in the following manner. Monochromatic light from a 1 -watt argon laser (not shown) having a wavelength of 4,579 Angstroms is passed through a beam-expanding objective, such as a conventional microscope objective of X10, then passed through a 75 cm. focal length and 10 cm. diameter collimating lens. The lens is corrected for third order aberrations and has antireflective coatings (Collimating optics are not shown). The collimated light 42 then enters the prism 38, is reflected by the prism diagonal interface 44 and passes from there through the oil 40 matching layer, the glass sheet 30, and spaces in the ruling 32. The optical equipment necessary to collimate light for illuminating the ruling may, of course, be varied according to known standards. After the monochromatic light 42 passes through the photomask 26 it forms a series of image planes spaced from one another by distances given by the equation 2 mentioned earlier. For the light of 4,579 A. this is an image plane about every 400 microns from the ruling 32.

The positioning of the substrate 28 in the image plane is facilitated by replacing the substrate 28 temporarily with a flat glass observation sheet which has arbitrary high-resolution information on the side facing the photomask. The observation sheet permits the diffraction image to be observed visually through a microscope positioned so that it focuses through the clear side of the observation sheet on the information-containing surface. Optimum parallel spacing of the target frame in the image plane is indicated by maximum symmetry of interference fringes appearing on the information-containing surface of the observation sheet. The fringes are perceptible to the unaided eye. The source of the fringes will be discussed later. Optimum linear spacing from the photomask 26 is adjusted after the target frame 24 has been adjusted to be parallel to the photomask 26. The adjustments are made by three micrometers 46 mounted to the target frame 24. To avoid unnecessary complexity, only two of the micrometers 46 are shown in FIG. 4. The linear adjustment is made by observing the diffraction image on the information-containing surface of the observation sheet through the microscope and adjusting all three micrometers 46 equal amounts until the desired diffraction image and the arbitrary high-resolution information appear simultaneously in focus.

For a given geometry of elements in the photomask ruling 32, it is possible to obtain a number of different geometries of array patterns in the diffraction image by varying slightly the linear spacing of the substrate 28 from the photomask 26 so that the photoresist 36 is no longer precisely in the image plane. In particular, the spacing is varied until an array of bright dots, smaller than the ruling 32 squares, is formed on a dark background. The correct spacing for such dots is readily achieved by simultaneous observation of the image through the microscope and adjustment of the micrometers 46.

After adjustments of the spacing of the target frame 24, the photoresist 36 is exposed to the dot array by eclipsing the light source, replacing the observation sheet with the substrate 28, freeing the light source momentarily and removing the substrate 28 from the frame. The substrate 28 is next processed in standard fashion to form P-type regions 14 shown in FIG. 2 corresponding to the dot pattern of the diffraction image. The processing includes the steps of developing the exposed photoresist 36, etching openings in the insulating layer 34, removing the unexposed photoresist 36, and covering the insulating layer 34 and exposed substrate 28 regions in the openings with a doped silicon layer. It is found that local variations in the brightness of the diffraction image due to isolated small defects in the photomask 26 are not ordinarily reproduced by the photoresist 36 because photoresist is generally insensitive to such small brightness variations.

The doped silicon layer of the target is next covered with photoresist and the photoresist is exposed to a diffraction image of an array of squares by generally the same process as described above for the exposure to an array of dots, except that the linear spacing is such that the photoresist lies precisely in the image plane. After exposure the resist is developed in standard fashion and the doped silicon layer etched to result in an array of silicon pads 18 on the P-type regions 14. Both the P type regions 14 and the pads 18 are entirely free from defects attributable to isolated small defects in the photomask 26. The pads 18 are in complete registry with the P-type regions 14 since the same photomask 26 is used to make both.

No contact whatsoever is required to the delicate photomask 26 ruling. The photoresist layer is positioned near the third image plane, occurring at about 1,200 microns from the photomask ruling.

The focal depth of the diffraction image plane is approximately ±5 microns. This requires a very precise positioning of the photoresist 36 so that it is completely parallel to the ruling 32. This precise parallelism is achieved by observation of interference fringes as described above. However, with standard commercially available substrates, residual interference fringes remain due to nonuniformity of substrate-to-photomask distance over the substrate surface. The presence of the interference fringes is due to the interaction of the coherent light with the effects of finite errors in flatness of both the photomask 26 surface and of the photosensitive surface of the photoresist 36. It has been found that the presence of interference fringes in the exposed photoresist pattern can be entirely eliminated if during exposure the photoresist 36 layer is repeatedly oscillated a distance of approximately a quarter the wavelength of the light in a direction normal to the photoresist 36 surface. This oscillation compensates for errors in the flatness of the photoresist 36 layer and photomask 26 surface by integrating the errors over each elemental portion of the surfaces so that the resulting exposure is essentially the same for all individual portions of the photoresist 36 surface.

Figure 5:
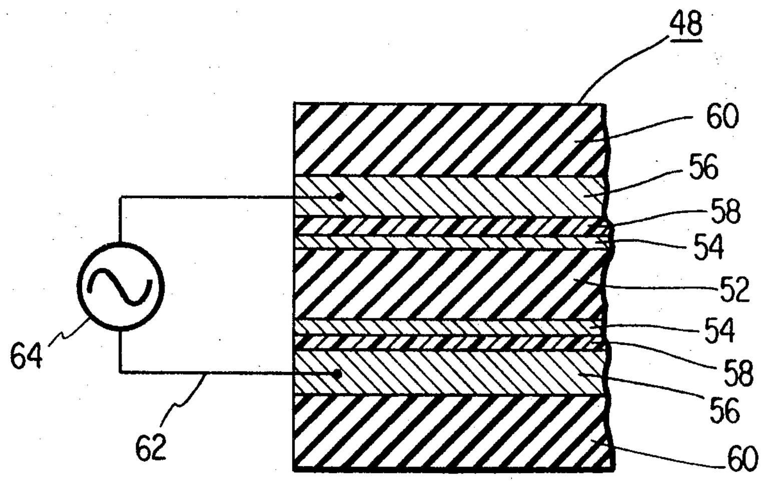
FIG. 5 is an exaggerated sectional view of a portion of a piezoelectric transducer of the apparatus of FIG. 4.

The oscillation is provided by placing under the shaft of each of the micrometers 46, before adjustment, a piezoelectric transducer 48 as shown in FIG. 4. The structure of the transducers 48 is shown in FIG. 5. Each transducer is a stack consisting of the following members: a thin piezoelectric disc 52 of a commercially available lead zirconate-titanate-type about 0.05-inch thick and 0.75 inch in diameter is provided on both faces with a thin layer of silver 54 for electrical contact; two thin brass discs 56 are joined to the silver layers by a very thin layer 58 of epoxy resin cement. The brass discs 56 are covered on their outer face by insulating discs 60. Wires 62 are connected to the brass discs 56 to establish electrical contact to the silver layers 54 through the epoxy cement layer 58. An alternating electrical voltage source 64 of 115 volts at 60 hertz derived from a 115-volt line by means of a variable voltage transformer is connected in parallel to the transducers 48 by the wires 62 and oscillates the thickness dimension of the piezoelectric discs 52 in response to the voltage applied to the silver layers 54 on their faces.

For a given available transducer 48, the alternating voltage source 64 is chosen so that the oscillation amplitude of the transducer 48 is essentially one-quarter the wavelength of the light used for exposure of the photosensitive surface 36. With the use of a variable voltage transformer most normally available alternating voltage sources may be used to power the transducers 48. The frequency of oscillation is generally not important so long as there is at least one-half cycle during the exposure time of the photoresist 36 and so long as it is low enough to permit the transducer 48 to respond with the desired thickness change. Several or more oscillations are desirable however, in order to minimize the effect of errors in the amplitude of the oscillation. The waveform of the current source 64 is also relatively unimportant, though a sine wave may give slightly better results in some instances than a square wave. The total mass of oscillating portions of the apparatus 20 should be reasonably low in order to avoid the necessity of high currents to the transducers 48 which might result in their overheating.

Other means may be used to obtain the desired oscillation. For example, mechanical means or magnetic means may be readily adapted to perform substantially the same function of oscillating the diffraction image with respect to the photosensitive surface 36 as is performed by the piezoelectric means described in the preferred embodiment.

GENERAL CONSIDERATIONS

The development of the photoresist depends on the general type of photoresist used. For developing positive photoresist the exposed portion is removed, whereas for developing negative photoresist the unexposed portion is removed. If a particular pattern formed with positive photoresist is to be formed with negative photoresist, then the photomask must be changed to one which is the negative counterpart of the original photomask and passes light where the original is opaque.

It is not necessary that the illumination source be a source of strictly coherent light. However, for high-definition and high area-density arrays, coherent light sources appear to give better results, largely because of the great intensity of monochromatic light available from such sources as lasers. An advantage of using noncoherent light, such as, for instance, from a high-pressure mercury arc, is that no oscillation of the target is necessary during exposure, since the coherence of such a source is not sufficient to form interference fringes on the target.

The technique of oscillating the photosensitive surface over a quarter wavelength of the exposure light during the time of exposure is particularly advantageous in that it permits the use of readily obtainable materials without resulting variations in the final pattern due to quality defects in the components. For instance, silicon wafer substrates which are flat to an accuracy of ±5 microns are readily obtainable. Without such oscillation it would be necessary to have surfaces for the ruling glass plate and for the silicon substrate which are flat to the highest precision presently available. Such a flatness requirement would result in a very expensive product. Even the flattest obtainable surfaces, however, would be likely to show some interference fringes without the use of oscillation during exposure. Where the photoresist is sensitive to only a narrow range of light wavelengths, such as a 100 A. range or a smaller one, it is possible to use a broad band light source, i.e., a source that is not monochromatic, without additional optical filtering. Under these conditions the photoresist acts as a narrow band filter for the light and makes high-quality diffraction imaging possible. Alternatively, situations exist where the combined effect of the photoresist sensitivity, the emission characteristics of the light source, and the absorption characteristics of the optical components used, perform the same function as a narrow band filter. In any such system employing polychromatic light, the effective size of the emitting area of the source plays an important role. If this effective size is too great, then the resolution obtainable in diffraction imaging is limited. The effective source size for a polychromatic source is controllable by correct choice of the collimating optics used.

The invention is applicable to any process which requires forming a high area-density array of photosensitive material. For instance, it may be used for making electrode screens used as accelerating electrodes for imaging electron tubes such as camera tubes. Such screens are essentially a thin metallic sheet having an array of very closely spaced holes and are described, for instance, in the U.S. Pat. No. 3,423,261 to J. J. Frantzen and U.S. Pat. No. 3,329.541 to N.B. Mears together with photomasking techniques for their fabrication which include forming an array of photoresist. In such screens it is important that there be no defects, since defects result in nonuniformities in the tube signal. For instance, the accelerating electrode mesh in a vidicon camera tube must be very uniform. Isolated small defects in the mesh cause variations in the beam landing on the target and degrade the quality of the signal from the target.

The present method may also be used to fabricate a defect-free photomask from a defective photomask having isolated, small defects. For example, if a photoemulsion on a transparent substrate is exposed to a diffraction image from a first photomask and then developed, a second photomask will be formed. The second photomask does not contain isolated small defects present in the first photomask.

Though at present the invention seems best suited for forming hightdefinition, high area-density arrays, it is applicable also to low area-density arrays. Indeed, it is applicable wherever self-imaging from a photomask results in a diffraction pattern that is useful for exposing photoresist to fabricate an array. Additional arrays which can be made by the present method are, for instance, solid-state imaging arrays and memory arrays such as for memory banks or storage tubes.

Present methods of fabricating halftone screens for photolithographic purposes, such as the method described in the U.S. Pat. No. 2,478,443 to J. A. C. Yule et al., for instance, use the shadow of a mask rather than a diffraction image for exposing photoresist. With present shadow methods no redundancy is obtained unless multiple, precisely spaced light sources are used. Furthermore, the shadow methods are limited to fabrication of relatively low area-density screens for which diffraction effects are minimal. With shadow methods diffraction effects are generally undesirable. They degrade the exposed pattern. With the novel method, however, diffraction effects are essential since they are responsible for the formation of the image used for exposure.

There are a great number of photomask patterns which will form a diffraction image. The basic requirement for self-imaging is that the photomask pattern be highly periodic. For each photomask pattern there are variations which can be obtained in the diffraction image by adjusting the spacing between the photomask and the photoresist. The present invention is not limited to the use of a particular design of photomask.

The novel method has been described in terms of a collimated light source and flat mask and photoresist surfaces but is not to be so limited. By providing appropriate curvature of the photomask and appropriate divergence of the light source it is possible to form a diffraction image which lies on a curved surface in space rather than on a plane surface. Thus, although considerable complexity is involved, it is possible to fabricate by diffraction imaging a uniform or nonuniform array on a curved surface.

I claim:

1. A method of defining an array of discrete areas on a substrate surface comprising:
   a. covering said surface with a photosensitive coating;
   b. exposing said photosensitive coating directly to a diffraction image from a photomask;
   c. developing said photosensitive coating to uncover said array of discrete areas of said surface.

2. The method defined in claim 1 and wherein said layer is exposed to a coherent, periodic array, planar light diffraction image.

3. The method defined in claim 1 wherein said substrate surface is a relatively flat semiconductor surface.

4. The method defined in claim 3 and wherein said substrate surface is a major surface of a silicon vidicon target substrate.

5. A method of forming a periodic array of material, comprising the steps of:
   b. covering a substrate surface with a layer of photosensitive material;
   b. exposing said layer directly to a periodic array diffraction image from a photomask, thereby forming exposed portions and unexposed portions of said layer, and
   c. removing said exposed portions of said layer, leaving an array of unexposed material.

6. The method defined in claim 5 and wherein said diffraction image is formed by passing collimated light through a photomask disposed perpendicularly to the direction of collimation of said light.

7. The method defined in claim 6 and wherein said light is coherent.

8. The method defined in claim 6 and wherein said light for forming said diffraction image is essentially monochromatic.

9. The method defined in claim 8 and comprising the step of moving said surface during said exposing for at least a distance of one-quarter wavelength of said coherent light in a direction perpendicular to said surface.

10. A method of forming a periodic array of material, comprising the steps of:
   a. covering a substrate surface with a layer of photosensitive material;
   b. exposing said layer directly to a periodic array diffraction image from a photomask, thereby forming exposed portions and unexposed portions of said material, and
   c. removing said unexposed portion of said layer, leaving an array of exposed material.

11. A method of fabricating a thin screen of a material, comprising:
   a. covering a major surface of a sheet of said material with a photoresist coating;
   b. exposing said photoresist coating to a diffraction image from a periodic array photomask;
   c. developing said photoresist to form a masking layer of said photoresist having the same periodicity as said diffraction image, said mesh of photoresist having interstices through which portions of said sheet are exposed, and
   d. etching away said exposed portions of said sheet to form a screen.

12. The method defined in claim 11 and including the step of removing said mesh of said photoresist from said screen.

13. The method defined in claim 11 and wherein:
   said sheet is of metal having a thickness less than 0.01 inch;
   said diffraction image is formed by passing collimated, essentially monochromatic light through a flat photomask having a regular pattern of openings, said photomask being disposed perpendicularly to said collimated light;
   said masking layer is removed after said etching.

14. The method defined in claim 13 and comprising the step of moving said surface at least once for a distance of one-quarter wavelength of said coherent light in a direction perpendicular to said surface during said exposing step.

15. A method of fabricating a camera tube target, comprising:
   a. providing a semiconductor substrate of a first conductivity type;
   b. covering said substrate with an insulating layer;
   c. covering said insulating layer with a first photoresist layer;
   d. exposing said first photoresist layer to a first diffraction image from a periodic array photomask;
   e. developing said first photoresist layer to form in it an array of openings corresponding to said diffraction image, said openings exposing said insulating layer;
   f. etching away said insulating layer in said openings to expose discrete regions of said substrate in said openings;
   g. covering said insulating layer and said substrate in said openings with a doping layer containing a dopant for converting said discrete regions of said substrate to a second conductivity type;
   h. covering said doping layer with a second photoresist layer;
   i. exposing said second photoresist layer to a second diffraction image from said photomask, said second image being in registry with said openings;
   j. developing said second photoresist layer to form an array of photoresist pads in registry with said openings, each of said pads being superimposed on and completely covering a single one of said openings;
   k. etching away said doping layer between said photoresist pads to form an array of doping layer pads under said photoresist pads;
   l. removing said photoresist pads; and
   m. driving said dopant from said doping layer into said substrate in said discrete regions of said substrate to change the conductivity type of said discrete regions and to form PN junctions between said discrete regions and said substrate.

* * * * *